(12) United States Patent
Zhou et al.

(10) Patent No.: US 10,529,271 B2
(45) Date of Patent: Jan. 7, 2020

(54) DISPLAY PANEL, ELECTRONIC DEVICE AND TEST METHOD

(71) Applicant: SHANGHAI TIANMA AM-OLED CO., LTD., Shanghai (CN)

(72) Inventors: Jingxiong Zhou, Shanghai (CN); Ruiyuan Zhou, Shanghai (CN)

(73) Assignee: SHANGHAI TIANMA AM-OLED CO., LTD., Shanghai (CN)

( * ) Notice: Subject to any disclaimer, the term of this patent is extended or adjusted under 35 U.S.C. 154(b) by 132 days.

(21) Appl. No.: 15/795,210

(22) Filed: Oct. 26, 2017

(65) Prior Publication Data

US 2018/0047804 A1    Feb. 15, 2018

(30) Foreign Application Priority Data

Apr. 24, 2017   (CN) .......................... 2017 1 0240512

(51) Int. Cl.
```
G09G 3/20       (2006.01)
G09G 3/00       (2006.01)
H01L 27/32      (2006.01)
G02F 1/1362     (2006.01)
G02F 1/13       (2006.01)
```

(52) U.S. Cl.
CPC ........... *G09G 3/2092* (2013.01); *G09G 3/006* (2013.01); *G02F 1/1309* (2013.01); *G02F 1/1362* (2013.01); *G02F 2001/136254* (2013.01); *H01L 27/3276* (2013.01)

(58) Field of Classification Search
CPC ..... G06F 3/0414; G06F 3/0428; G09G 3/006; G09G 3/2092; H01L 27/3276; G02F 1/1309; G02F 1/1362; G02F 2001/136254
See application file for complete search history.

(56) References Cited

U.S. PATENT DOCUMENTS

| | | | |
|---|---|---|---|
| 10,037,726 B2 * | 7/2018 | Lee .................... | G09G 3/2003 |
| 2004/0263460 A1 * | 12/2004 | Lu ......................... | G09G 3/006 |
| | | | 345/98 |
| 2009/0109142 A1 * | 4/2009 | Takahara ............... | G09G 3/006 |
| | | | 345/76 |

(Continued)

FOREIGN PATENT DOCUMENTS

| | | |
|---|---|---|
| CN | 1556436 A | 12/2004 |
| CN | 101004490 A | 7/2007 |

(Continued)

*Primary Examiner* — Xuemei Zheng
(74) *Attorney, Agent, or Firm* — Kilpatrick Townsend & Stockton, LLP

(57) ABSTRACT

Provided are a display panel, an electronic device and a test method. The display panel includes: multiple data lines extending in a first direction; a display array including multiple pixel units arranged in an array, where the columns of the pixel units are electrically connected to the data lines respectively; a test switching circuit arranged at one side of the display array and test pins and a drive pin arranged at the other side of the display array in the first direction, where the test switching circuit includes a control end, input ends and output ends, the drive pin is connected to the control end, the test pins are configured to input a test signal and are connected to the input ends via a portion of the data lines, and the remaining data lines are connected to the output ends.

20 Claims, 12 Drawing Sheets

(56) References Cited

U.S. PATENT DOCUMENTS

| | | | |
|---|---|---|---|
| 2011/0037746 A1 | 2/2011 | Kim et al. | |
| 2013/0321499 A1* | 12/2013 | Park | G09G 3/20 345/698 |
| 2014/0029230 A1* | 1/2014 | Oh | H05K 1/14 361/803 |
| 2016/0013777 A1* | 1/2016 | Duan | H03K 4/08 345/208 |
| 2016/0274387 A1* | 9/2016 | Zheng | G02F 1/1309 |
| 2016/0293077 A1 | 10/2016 | Ma | |
| 2016/0321971 A1* | 11/2016 | Chai | G09G 3/20 |
| 2016/0336461 A1* | 11/2016 | Wang | H01L 29/78696 |
| 2017/0194219 A1* | 7/2017 | Ji | H01L 22/34 |
| 2018/0075791 A1* | 3/2018 | Li | G09G 3/006 |
| 2018/0082622 A1* | 3/2018 | Bae | G09G 3/006 |
| 2018/0175729 A1* | 6/2018 | Cao | H02H 7/1213 |
| 2018/0203315 A1* | 7/2018 | Wang | G01R 31/44 |

FOREIGN PATENT DOCUMENTS

| | | |
|---|---|---|
| CN | 101833910 A | 9/2010 |
| CN | 104698637 A | 6/2015 |
| CN | 106293186 A | 1/2017 |
| KR | 20110034871 A | 4/2011 |

\* cited by examiner

DISPLAY PANEL, ELECTRONIC DEVICE AND TEST METHOD

PRIORITY CLAIM

The present application claims the priority to Chinese Patent Application No. 201710270512.3, titled "DISPLAY PANEL, ELECTRONIC DEVICE AND TEST METHOD", filed on Apr. 24, 2017 with the State Intellectual Property Office of the PRC, which is incorporated herein by reference in its entirety.

FIELD

The present disclosure relates to the field of display technologies, and in particular to a display panel, an electronic device and a test method.

BACKGROUND

With the continuous development of science and technologies, more and more electronic devices with display functions are widely applied in people's daily lives and work, greatly facilitate people's daily lives and work and become important and indispensable tools. A display panel is a main component for the display function of the electronic device. A liquid crystal display panel and an organic light emitting diode (OLED) display panel are two mainstream display panels in the conventional display art. Besides, display technologies including micro light emitting diode (LED) display, quantum dot light emitting diodes display and the like are also booming.

The display panel includes a border region and a display region. The display region is provided with a display array which includes multiple pixel units arranged in an array, and the border region is provided with a drive chip configured to drive the pixel units for image display. The border region is further provided with a drive pin, a test pin and a test switching circuit. Before the drive chip is bound, whether the display panel can display normally is detected with the drive pin, the test pin and the test switching circuit, to prevent the drive chip from being bound on a display panel which does not meet a quality standard and avoid a damage or waste of the high cost drive chip.

The drive pin is configured to switch on or switch off the test switching circuit. The test pin is configured to provide a test signal to a data line via the test switching circuit, to test the display performance of the pixel units in the display region. In conventional display panels, a signal line for connecting the test pin with the test switching circuit needs to be arranged separately in the border region, so that the test signal can be provided to the test switching circuit via the test pin, which does not facilitate a narrow border design of the display panels.

SUMMARY

To address the above issues, a display panel, an electronic device and a test method are provided according to the present disclosure. In the solution, a data line is reused as a signal line for a test pin, thereby reducing the width of a border region and facilitating a narrow border design of the display panel.

To achieve the above objectives, the following technical solutions are provided according to the present disclosure.

A display panel is provided according to the present disclosure. The display panel includes: multiple data lines arranged in parallel and extending in a first direction; a display array including multiple pixel units arranged in an array, where the number of columns of the pixel units is equal to the number of the data lines, and the columns of the pixel units are electrically connected to the data lines respectively; a test switching circuit arranged at one side of the display array in the first direction; and test pins and a drive pin arranged at the other side of the display array in the first direction, where, the test switching circuit includes a control end, input ends and output ends, the drive pin is electrically connected to the control end and is configured to input a switch control signal, the test pins are configured to input a test signal and are electrically connected to the input ends via a portion of the data lines, and the remaining data lines are electrically connected to the output ends.

An electronic device is further provided according to the present disclosure. The electronic device includes the above display panel.

A test method applied in the above display panel is further provided according to the present disclosure. The display panel includes the display array, the data lines, the test switching circuit, the drive pin and the test pins, and the display array includes multiple pixel units arranged in an array. The test method includes: providing, by the drive pin, the switch control signal to the control end of the test switching circuit, via a signal line arranged in a border region of the display panel, to control to switch on or switch off the test switching circuit; and providing, by the test pins, the test signal to the input ends of the test switching circuit via a portion of the data lines, and outputting, by the test switching circuit, the test signal via the remaining data lines.

It can be seen from the above description that, in the display panel, electronic device and test method according to the present disclosure, the test pins are electrically connected to the input ends via a portion of the data lines and provide the test signal via these data lines. The remaining data lines are electrically connected to the output ends. The data lines are reused as the signal lines for the test pins, instead of arranging the signal lines for the test pins in the border region, thereby reducing the width of the border region and facilitating a narrow border design of the display panel. The portion of the data lines are reused as the signal lines for the test pins to perform a display test on the pixel units in the display panel. This portion of the data lines can provide data lines for the pixel units connected to the portion of the data lines while providing the test signal to the pixel units connected to the remaining data lines. Since the luminance of the pixel units depend on stabilized voltages on all of the data lines, there is no difference between the luminance of the pixel units connected to the above portion of the data lines and the luminance of the pixel units connected to the remaining data lines, and the test accuracy may not be affected.

BRIEF DESCRIPTION OF THE DRAWINGS

The drawings to be used in the description of the embodiments or the conventional technology are described briefly as follows, so that the technical solutions according to the embodiments of the present disclosure or according to the conventional technology become clearer. It is apparent that the drawings in the following description only illustrate some embodiments of the present disclosure. For those skilled in the art, other drawings may be obtained according to these drawings without any creative work.

DETAILED DESCRIPTION OF EMBODIMENTS

Hereinafter technical solutions in embodiments of the present disclosure are described clearly and completely in conjunction with the drawings. Apparently, the described embodiments are only a few rather than all of the embodiments of the present disclosure. Any other embodiments obtained by those skilled in the art based on the embodiments of the present disclosure without any creative effort fall within the scope of protection of the present disclosure.

Hereinafter, the technical solutions according to embodiments of the present disclosure are further described in details in conjunction with the drawings, hence the technical solutions become clearer.

Figure 1A:
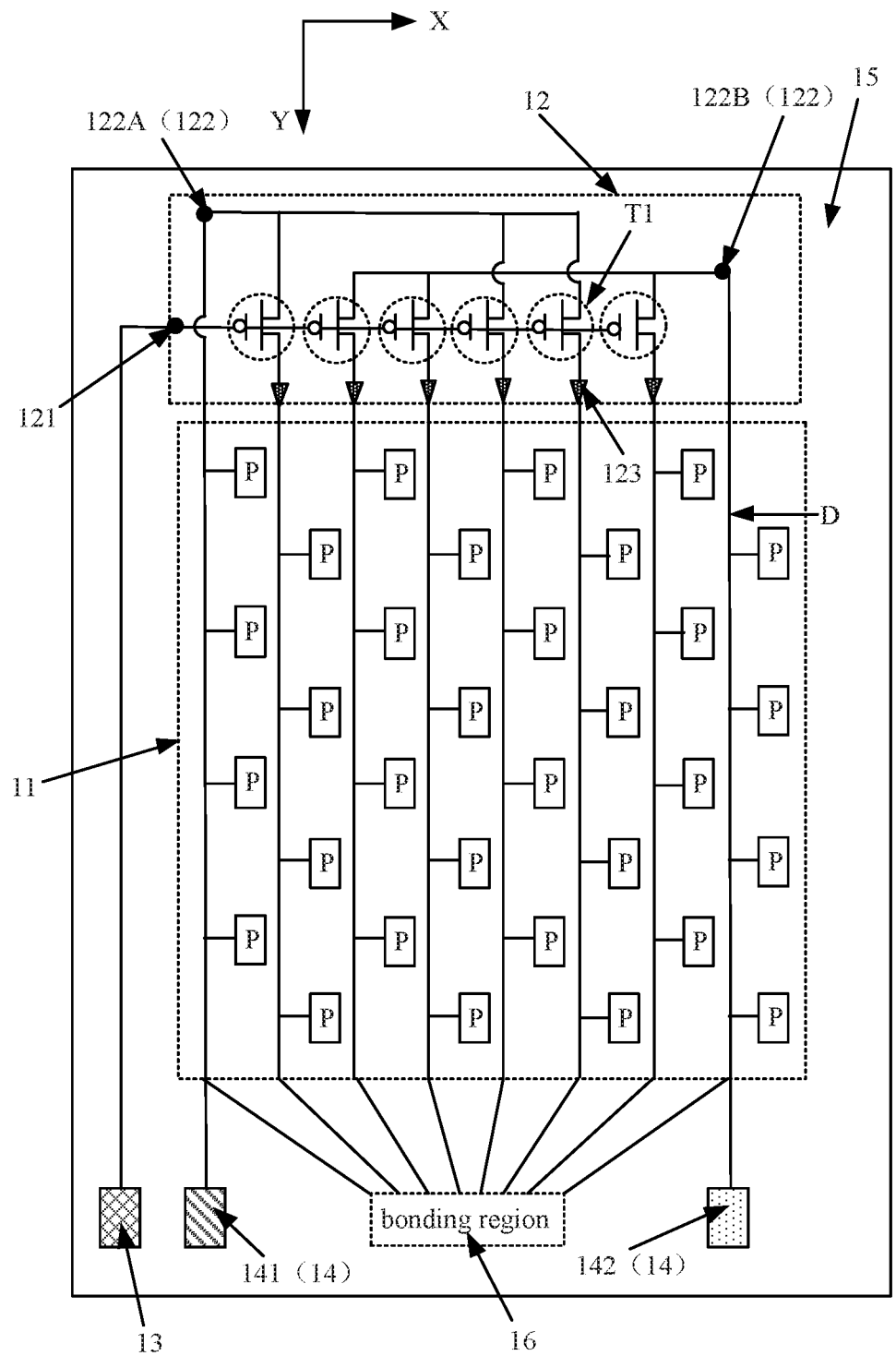
FIG. 1A is a schematic structural diagram of a display panel according to an embodiment of the present disclosure.

Reference is made to FIG. 1A, which is a schematic structural diagram of a display panel according to an embodiment of the present disclosure. The display panel includes multiple data lines D, a display array 11, a test switching circuit 12, a drive pin 13 and test pins 14. The data lines D are arranged in parallel and extend in a first direction Y. The display array 11 includes multiple pixel units P arranged in an array, the number of columns of the pixel units P is equal to the number of the data lines D, and the columns of the pixel units P are electrically connected to the data lines D respectively. In the first direction Y, the test switching circuit 12 is arranged at one side of the display array 11, and the drive pin 13 and the test pins 14 are arranged at the other side of the display array 11.

The test switching circuit 12 includes a control end 121, input ends 122, and output ends 123. The drive pin 13 is electrically connected to the control end 121. The drive pin 13 is configured to input a switch control signal for controlling to switch on or switch off the test switching circuit 12. The test pins 14 are configured to input a test signal. The test pins 14 are electrically connected to the input ends 122 via a portion of the data lines D, while the remaining data lines D are electrically connected to the output ends 123.

The display panel includes a display region and a border region 15 surrounding the display region. The display array 11 is arranged in the display region.

In the display panel according to the embodiment of the present disclosure, the test signal is provided to the input ends 122 of the test switching circuit 12 via a portion of the data lines D. This portion of the data lines D are reused as signal lines for the test pins 14, instead of additionally arranging the signal lines for the test pins 14 in the border region 15 of the display panel, thereby reducing the width of the border region of the display panel and facilitating a narrow border design of the display panel.

It is provided that, the number of the test pins 14 is represented as m, m is a positive integer, the number of the data lines D is represented as n, n is a positive integer, the test switching circuit 12 includes one control end 121, a input ends 122 and b output ends 123, both a and b are positive integers. In addition, m, n, a and b meet following relational expressions: $a+b \leq n$, $a \leq m$ and $m+b=n$. The test pins 14 are electrically connected to the input ends 122 via the portion of the data lines D respectively, and the output ends 123 are electrically connected to the remaining data lines D respectively.

The test switching circuit 12 includes b first thin film transistors T1 arranged in sequence in a second direction X. The second direction X is perpendicular to the first direction Y and is parallel to a row direction of the pixel units P. The first thin film transistors T1 correspond to the output ends 123 respectively. In FIG. 1A, each dashed circle indicates one first thin film transistor T1. The shown dashed circles are only for indicating positions of the first thin film transistors T1, and do not exist actually.

Each of the first thin film transistor T1 has a control electrode, a first electrode and a second electrode. The first electrodes of the first thin film transistors T1 are electrically connected to the output ends 123 corresponding to the first thin film transistors T1 respectively. The control electrodes of all of the first thin film transistors T1 are electrically connected to the control end 121. The second electrode of each of the first thin film transistors T1 is electrically connected to one of the input ends 122. That is, the test switching circuit 12 includes the first thin film transistors T1 corresponding to the output ends 123 respectively, and the first electrode of the first thin film transistor T1 serves as the output end 123.

In the embodiment shown in FIG. 1A, a=2, i.e., the test switching circuit includes two input ends 122 which are an odd input end 122A and an even input end 122B respectively. In FIG. 1A, only eight columns of pixel units P are shown, i.e., n=8. The number of the data lines, n, is a constant, which depends on the number of columns of the pixel units P in the display panel and is not limited to the embodiment shown in FIG. 1A.

In the display panel shown in FIG. 1A, the pixel units P in the display array 11 are arranged in a pixel rendering manner. All the odd columns of the display array 11 have a same number of the pixel units P, all the even columns of the display array 11 have a same number of the pixel units P, and the number of the pixel units P in the odd column is the same as the number of the pixel units P in the even column or differs from the number of the pixel units P in the even column by one pixel unit. In the second direction X, the pixel units P in any odd column are aligned with the pixel units P in another odd column respectively, and the pixel units P in any even column are aligned with the pixel units P in another even column respectively. In the first direction Y, distances between any two adjacent pixel units P are the same with each other. In the second direction X, distances between any two adjacent pixel units P are the same with each other. The distance between two adjacent pixel units P in the first direction Y may be the same as or different from the distance between two adjacent pixel units P in the second direction X. The pixel units P in the odd column are arranged staggeredly relative to the pixel units P in the even column, and the pixel units P in an odd row are arranged staggeredly relative to the pixel units P in an even row. Therefore, a center region for four pixel units P which are determined by intersecting any two adjacent odd columns with any two adjacent odd rows, includes one pixel unit P which is located in both an even column and an even row. A center region for four pixel units P which are determined by intersecting any two adjacent even columns with any two adjacent even rows, includes one pixel unit P located in both an odd column and an odd row.

In a case that the pixel units P are arranged in a pixel rendering manner, if n is an even number, then n is set as n=2N, with N being a positive integer. In the second direction X, 2N data lines D are divided equally into N groups, and each group includes two adjacent data lines D. In one embodiment, the i-th group includes the (2i−1)-th data line D and the 2i-th data line D, and i is a positive integer not greater than N. If n=8, then N=4. In this case, in the second direction X, four groups are the first group to the fourth group in sequence, and eight data lines D are the first data line D to the eighth data line D in sequence, the first group includes the first data line D and the second data line D, the second group includes the third data line D and the fourth data line D, the third group includes the fifth data line D and the sixth data line D, and the fourth group includes the seventh data line D and the eighth data line D.

In this case, it may be set that m=2, i.e., the display panel includes two test pins 14. One of the two test pins is an odd pin 141 and the other one of the two test pins is an even pin 142. The odd pin 141 is electrically connected to the odd input end 122A via one data line D in an odd group, and the remaining N−1 data lines D in all of odd groups are electrically connected to the odd input end 122A via the output ends 123 corresponding to the remaining N−1 data lines D in all of the odd groups respectively. The even pin 142 is electrically connected to the even input end 122B via one data line in an even group, and the remaining N−1 data lines D in all of even groups are electrically connected to the even input end 122B via the output ends 123 corresponding to the remaining N−1 data lines D in all of the even groups respectively.

As shown in FIG. 1A, the odd pin 141 is electrically connected to the odd input end 122A via the first data line D in the first group, while the second data line D in the first group, and the fifth and sixth data lines D in the third group are electrically connected to the odd input end 122A via the corresponding output ends 123 respectively. The even pin 142 is electrically connected to the even input end 122B via the eighth data line D in the fourth group, while the seventh data line D in the fourth group, and the third and fourth data lines D in the second group are electrically connected to the even input end 122B via the corresponding output ends 123 respectively.

In a case that the pixel units P are arranged in the pixel rendering manner, the pixel units P in two adjacent columns are arranged staggeredly relative to each other and the pixel units P in two adjacent rows are arranged staggeredly relative to each other. In any two adjacent columns of the pixel units P, one column includes pixel units P with a first color, and the other column includes pixel units P with a second color and pixel units P with a third color which are arranged alternately. The first color, the second color and the third color may be different from each other, of which one may be set as red, another one may be set as green and the remaining one may be set as blue. In a case that the pixel units P are arranged in the pixel rendering manner, a large resolution is achieved once large distance is arranged between two most adjacent pixel units. In the display panel according to the embodiment of the present disclosure, a test signal can be provided to the adjacent data lines D in all of the odd groups simultaneously, to determine whether a problem including a short circuit occurs among the pixel units P electrically connected to the data lines D in all of the odd groups. A test signal can be provided to the adjacent data lines D in all of the even groups simultaneously, to determine whether a problem including a short circuit occurs among the pixel units P electrically connected to the data lines D in all of the even groups. The data lines D in the odd groups and the data lines D in the even groups are not provided with the test signal simultaneously.

The drive pin 13 provides the switch control signal to the control end 121 via the signal line arranged in the border region 15, to switch on or switch off the first thin film transistors T1. The first thin film transistor T1 may be a P-channel Metal Oxide Semiconductor (PMOS), which is switched on if the switch control signal is at a low level, and is switched off if the switch control signal is at a high level. The first thin film transistor T1 may also be an N-channel Metal Oxide Semiconductor (NMOS), which is switched off if the switch control signal is at a low level, and is switched on if the switch control signal is at a high level.

In a case that all of the first thin film transistors T1 are switched on, the test signal may be provided to the data lines D electrically connected to the odd input end 122A and the data lines D electrically connected to the even input end 122B in a time-sharing manner via the odd pin 141 and the even pin 142 respectively, so as to test whether a problem including a short circuit or an open circuit occurs among the pixel units in the display panel A bonding region 16 is arranged at the side of the display array 11 where the test pins 14 are arranged and is configured to bond a drive chip. In the case that a test is completed and it is determined that no problem including short circuit, open circuit or the like occurs among the pixel units P, the drive chip is bound within the bonding region 16. The drive chip is configured to drive the pixel units P to display an image. The bonding region 16 is located at the side of the display array 11 away from the test switching circuit 12, and the bonding region 16 are arranged at the same side with the test pins 14 and the drive pin 13, thereby facilitating wire layouts for the test pins 14, the drive pin 13 and the test switching circuit 12 in the border region 15.

In the embodiment shown in FIG. 1A, the odd pin 141 is electrically connected to the odd input end 122A via the first data line D, and the even pin 142 is electrically connected to the even input end 122B via the n-th data line D. The odd pin 141 and the even pin 142 are arranged at two sides of the bonding region 16 respectively, thereby facilitating the wire layouts for the odd pin 141 and the even pin 142 in the border region 15 and facilitating to connect the odd pin 141 and the even pin 142 to the corresponding data lines D.

Figure 1B:
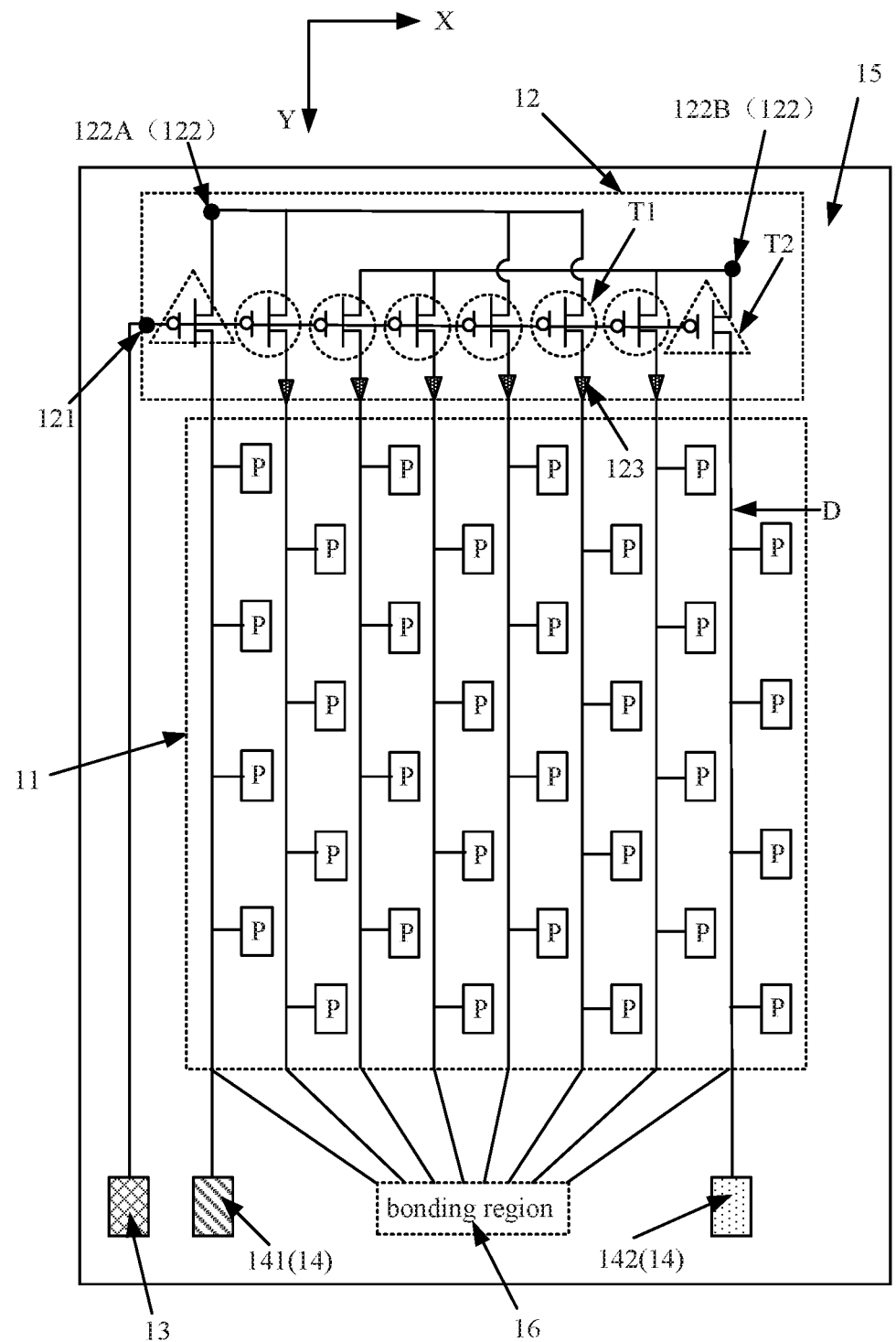
FIG. 1B is a schematic structural diagram of a display panel according to an embodiment of the present disclosure.

Reference is made to FIG. 1B, which is a schematic structural diagram of a display panel according to an embodiment of the present disclosure. On the basis of the embodiment shown in FIG. 1A, in the display panel shown in FIG. 1B, the test switching circuit 12 further includes m second thin film transistors T2. The second thin film transistor T2 includes a control electrode, a first electrode, and a second electrode. The control electrodes of all of the second thin film transistors T2 are electrically connected to the control end 121, the first electrodes of the second thin film transistors T2 are electrically connected to the test pins 14 corresponding to the second thin film transistors T2 via the data lines D corresponding to the second thin film transistors respectively, and the second electrodes of the second thin film transistors T2 are electrically connected to the input ends 122. It should be noted that, dashed triangles are only for illustrating positions of the second thin film transistors T2, and do not indicate actual structural patterns. The test switching circuit 12 includes the second thin film transistors corresponding to the test pins respectively.

In FIG. 1B, m=a=2, and the test pins 14 are connected to the input ends 122 respectively. The test pins 14 correspond to the second thin film transistors T2 respectively. The odd pin 141 is electrically connected to the odd input end 122A via one of the second thin film transistors T2, and the even pin 142 is electrically connected to the even input end 122B via the other one of the second thin film transistors T2. In this way, the data lines D are connected to the test switching circuit 12 via the thin film transistors respectively, thereby improving the stability and reliability of the test switching circuit 12.

Generally, the display panel includes many data lines D, and the data lines connected to the input ends 122 are fewer than the data lines D connected to the output ends 123. Therefore, in a case that all of the thin film transistors in the test switching circuit 12 are switched on, a current in the second thin film transistor T2 is greater than a current in the first thin film transistor T1. Thus, it is taken a long time to achieve a stabilized voltage on the data lines D, which affects a response speed of image switching during a test. To address the issue, in the embodiment of the present disclosure, the second thin film transistor T2 has a greater channel width to length ratio than the first thin film transistor T1, thereby shortening the time for stabilizing the voltage on the data lines D and improving the response speed of image switching during the test.

Generally, the display panel according to the embodiment of the present disclosure includes at least two test pins 14. The bonding region 16 is arranged at the side of the display array 11 where the test pins 14 are arranged and is configured to bond the drive chip. In a case that the number of the test pins 14 is more than one, the test pins 14 are arranged in sequence in the second direction X and the bonding region 16 is arranged between two of the test pins 14, hence to facilitate the wire layout and connection of the test pins 14 and the data lines D corresponding to the test pins 14.

On the basis of the above embodiments, to avoid a leakage current or residual charges on the first thin film transistor from influencing the display performance of the display panel, in the display panel according to an embodiment of the present disclosure, the second electrodes of all of the first thin film transistors electrically connected to a same input end are grounded or electrically connected to a voltage input end via a same resistor, and the second electrodes of the first thin film transistors electrically connected to different input ends are grounded or electrically connected to the voltage input end via different resistors respectively. In this case, the structure of the display panel may be as shown FIG. 1C.

Figure 1C:
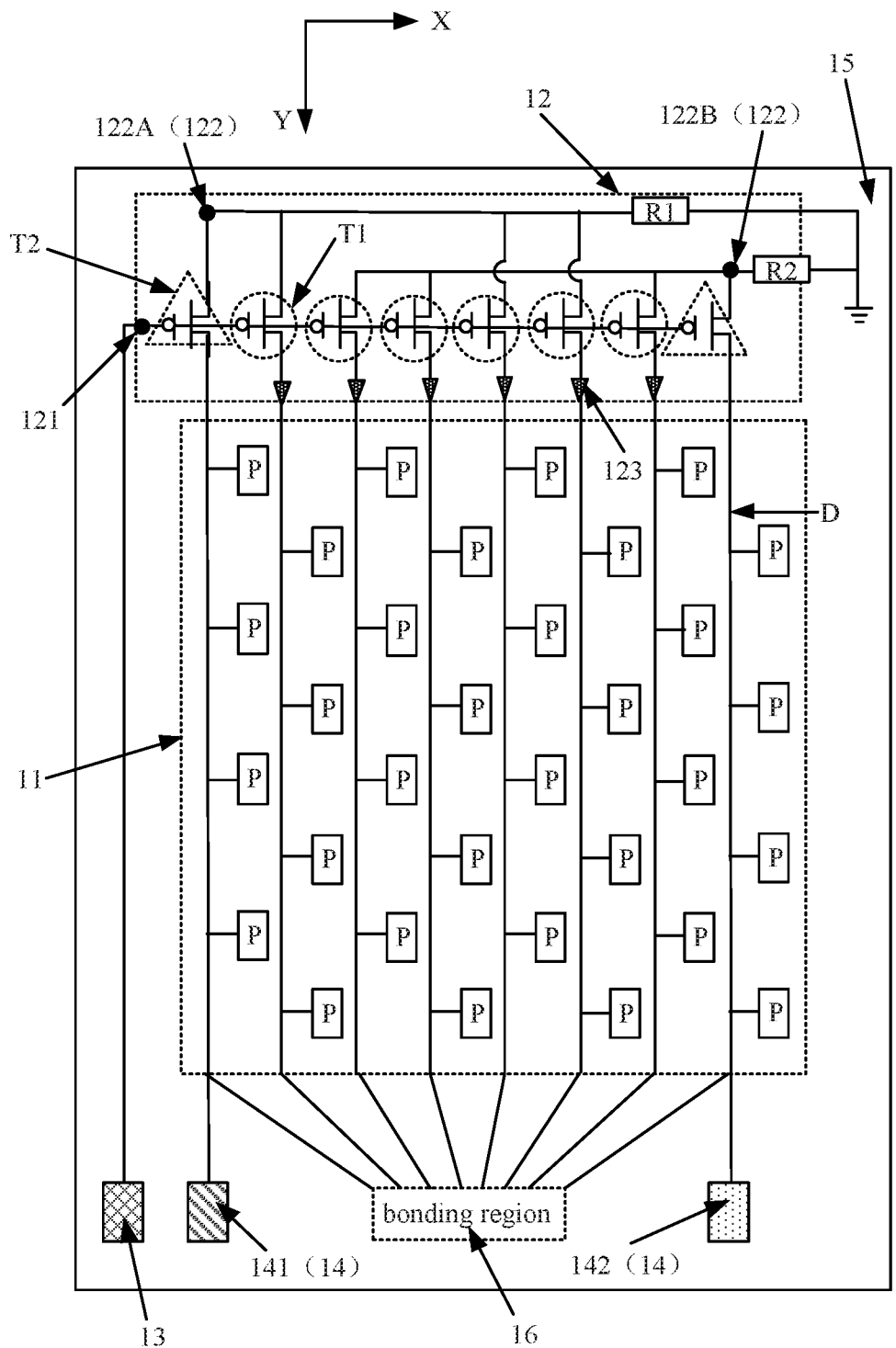
FIG. 1C is a schematic structural diagram of a display panel according to an embodiment of the present disclosure.

Reference is made to FIG. 1C, which is a schematic structural diagram of a display panel according to an embodiment of the present disclosure. On the basis of the display panel shown in FIG. 1B, in the display panel shown in FIG. 1C, the second electrodes of all of the first thin film transistors T1 electrically connected to the odd input end 122A are grounded via a first resistor R1, and the second electrodes of all of the first thin film transistors T1 electrically connected to the even input end 122B are grounded via a second resistor R2.

To avoid the resistor from consuming much electrical energy during a test of the display panel, the resistance value of the resistor connected to the thin film transistor needs to be large enough to ensure that the test signal is provided mainly for the display unit to perform the test. The resistor may be prepared from a semiconductor layer or a metal layer in the display panel. The resistor is prepared by reusing the semiconductor layer or the metal layer already exiting in the display panel. The resistor is formed while an active region of the thin film transistor is formed with the semiconductor layer, alternatively, the resistor is formed while an inner conductive structure of the display panel is formed with the metal layer. In this case, neither the preparation process nor the panel width is increased, thereby achieving a low preparation cost and a simple process.

As shown in FIG. 1C, in a case that the display panel includes the second thin film transistors T2, the first thin film transistors T1 and the second thin film transistors T2 electrically connected to a same input end 122 are grounded or electrically connected to the voltage input end via a same resistor. As shown in FIG. 1C, the first thin film transistors T1 and the second thin film transistor T2 connected to the odd input end 122A are grounded via a first resistor R1, and the first thin film transistors T1 and the second thin film transistor T2 connected to the even input end 122B are grounded via a second resistor R2.

In FIG. 1C, the resistor is directly grounded. In other embodiments, the resistor may be connected to the voltage input end in the display panel instead of being grounded. In a case that the resistor is connected to the voltage input end, the voltage input end is a voltage signal end in the display panel, the voltage signal end may be an alternating current signal end or a direct current signal end. To avoid an effect on the test signal inputted by the test bin by a voltage signal fluctuation in the voltage signal end, the direct current signal end is preferred.

In a case that the display panel is a liquid crystal display (LCD) display panel, the voltage input end may be configured to input one of a common voltage signal, a direct-current voltage signal of a scanning circuit and a data signal of the scanning circuit. In a case that the display panel is an organic light emitting diode (OLED) display panel, the voltage input end may be configured to input one of a cathode voltage signal, a direct-current voltage signal of a scanning circuit and a data signal of the scanning circuit. It should be noted that, the signal ends described in the above are only examples, and the voltage input end according to the present disclosure is not limited thereto. The voltage input end may be other available signal ends in the display panel, depending on the circumstances.

Figure 2A:
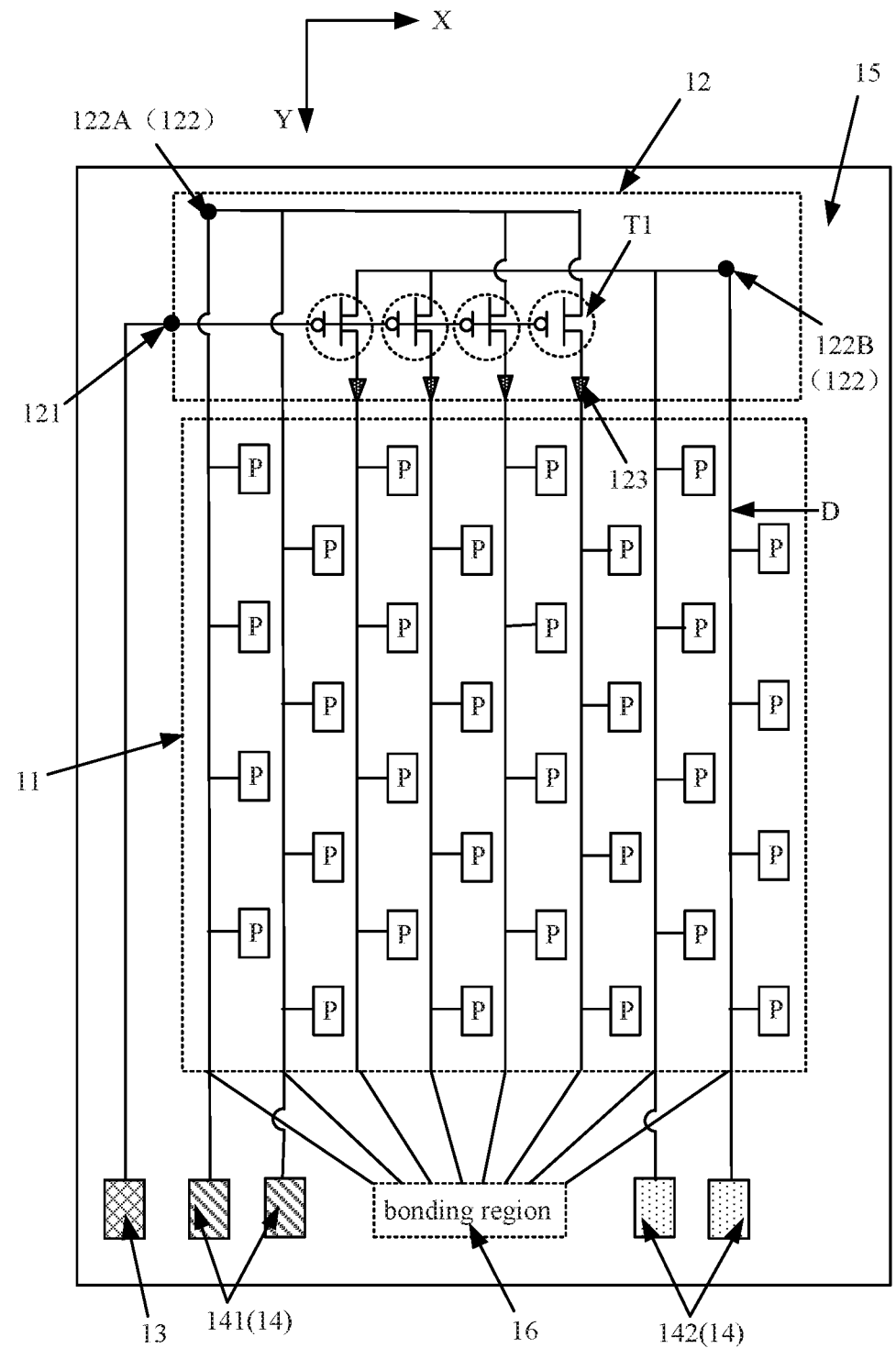
FIG. 2A is a schematic structural diagram of a display panel according to an embodiment of the present disclosure.

On the basis of the above embodiments, in a case that the display panel includes the above two input ends 122 and the pixel units P in the display array 11 are arranged in a pixel rendering manner, a structure of the display panel may be as shown in FIG. 2A.

Reference is made to FIG. 2A, which is a schematic structural diagram of a display panel according to an embodiment of the present disclosure. The embodiment shown in FIG. 2A differs from the embodiment shown in FIG. 1A in that m=4, i.e., the display panel includes four test pins 14. Two of the four test pins 14 are odd pins 141, and the other two of the four test pins are even pins 142. The two odd pins 141 are electrically connected to the odd input end 122A via two data lines D in a same odd group respectively, and the remaining N−2 data lines D in all of odd groups are electrically connected to the odd input end 122A via the output ends 123 corresponding to the remaining N−2 data lines in all of the odd groups respectively. The two even pins 142 are electrically connected to the even input end 122B via two data lines D in a same even group respectively, and the remaining N−2 data lines D in all of even groups are electrically connected to the even input end 122B via the output ends 123 corresponding to the remaining N−2 data lines in all of the even groups respectively.

In the embodiment shown in FIG. 2A, two test pins 14 are adopted to simultaneously provide test signals to the odd input end 122A, and two test pins 14 are adopted to simultaneously provide test signals to the even input end 122B, thereby improving a drive capability as compared with the embodiment shown in FIG. 1A.

In order to improve the drive capability, one input end 122 may be connected to multiple test pins 14 via the data lines respectively. It should be noted that, it is not limited to simultaneously inputting test signals from two test pins 14 to one input end 122. Test signals may be simultaneously inputted from more than two test pins 14 to one input end 122.

Figure 2B:
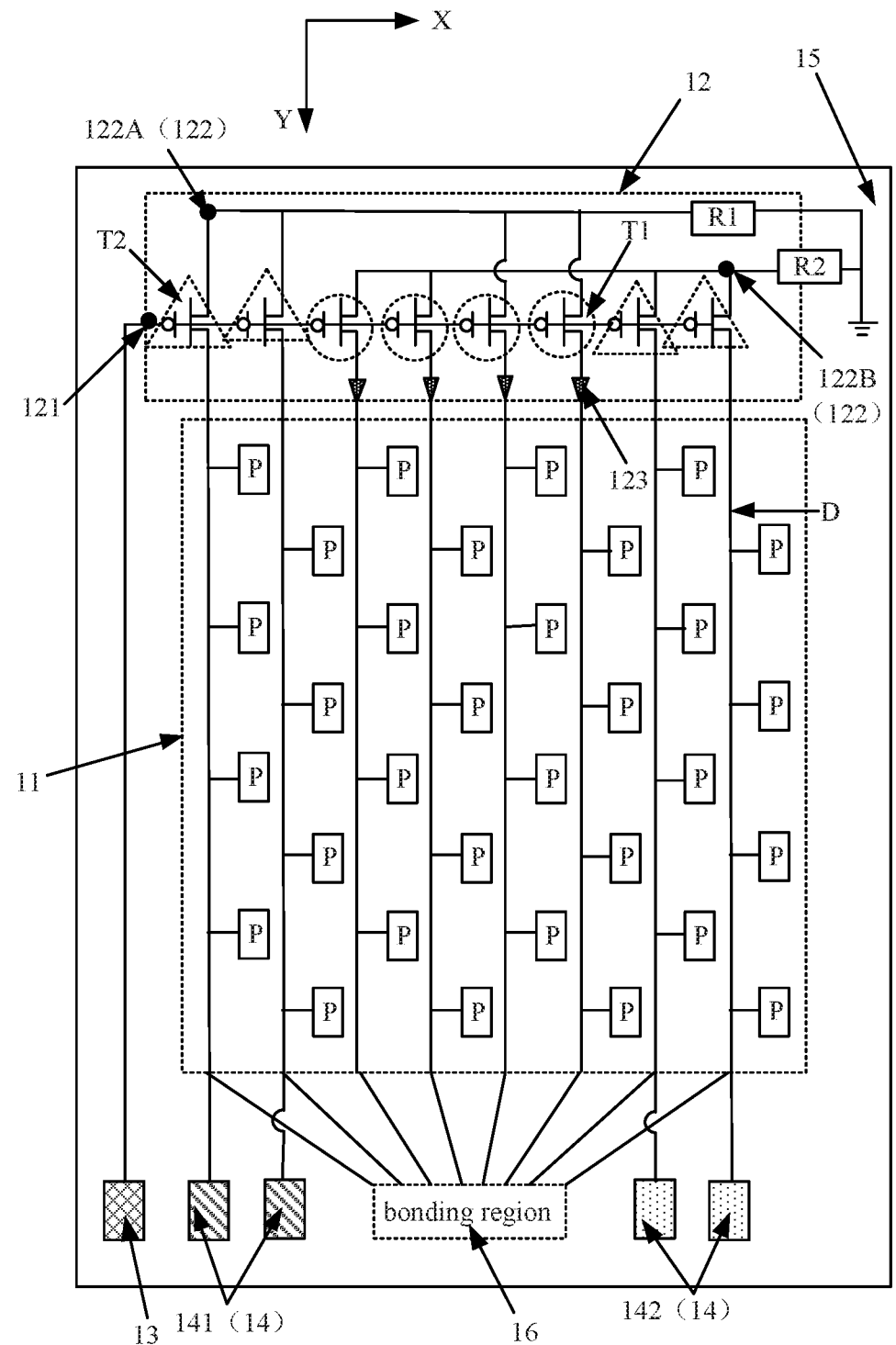
FIG. 2B is a schematic structural diagram of a display panel according to an embodiment of the present disclosure.

Reference is made to FIG. 2B, which is a schematic structural diagram of a display panel according to an embodiment of the present disclosure. In the embodiment shown in FIG. 2B, the data line D connected to the test pin 14 is connected to the input end 122 via one second thin film transistor T2. In this case, all of the data lines are connected to the input end 122 via the thin film transistors respectively, thereby ensuring the reliability and stability of the test switching circuit 12. Likewise, to avoid the leakage current and residual charges on thin film transistors in the test switching circuit 12 from interfering the performance of the display panel, the second electrodes of all of the thin film transistors connected to the odd input end 122A are grounded via a first resistor R1, and the second electrodes of all of the thin film transistors connected to the even input end 122B are grounded via a second resistor R2. In other embodiments, the resistor may be connected to a preset voltage input end.

In a case that the display panel includes the above two input ends 122 and all of the pixel units P are arranged in a matrix, that is, in any two adjacent columns of the pixel units P, the pixel units P in one column is aligned with the pixel units P in the other column respectively in the second direction X. If the size of the display panel is fixed, since the distance between two adjacent pixel units P in a same row of the display array 11 in which the pixel units P are arranged in the matrix is small to achieve a high resolution, and the test signal needs to be inputted in an interlacing manner to test whether a short circuit occurs between the two adjacent pixel units P. In this case, on the basis of the above embodiments, the structure of the display panel may be as shown in FIG. 3A.

Figure 3A:
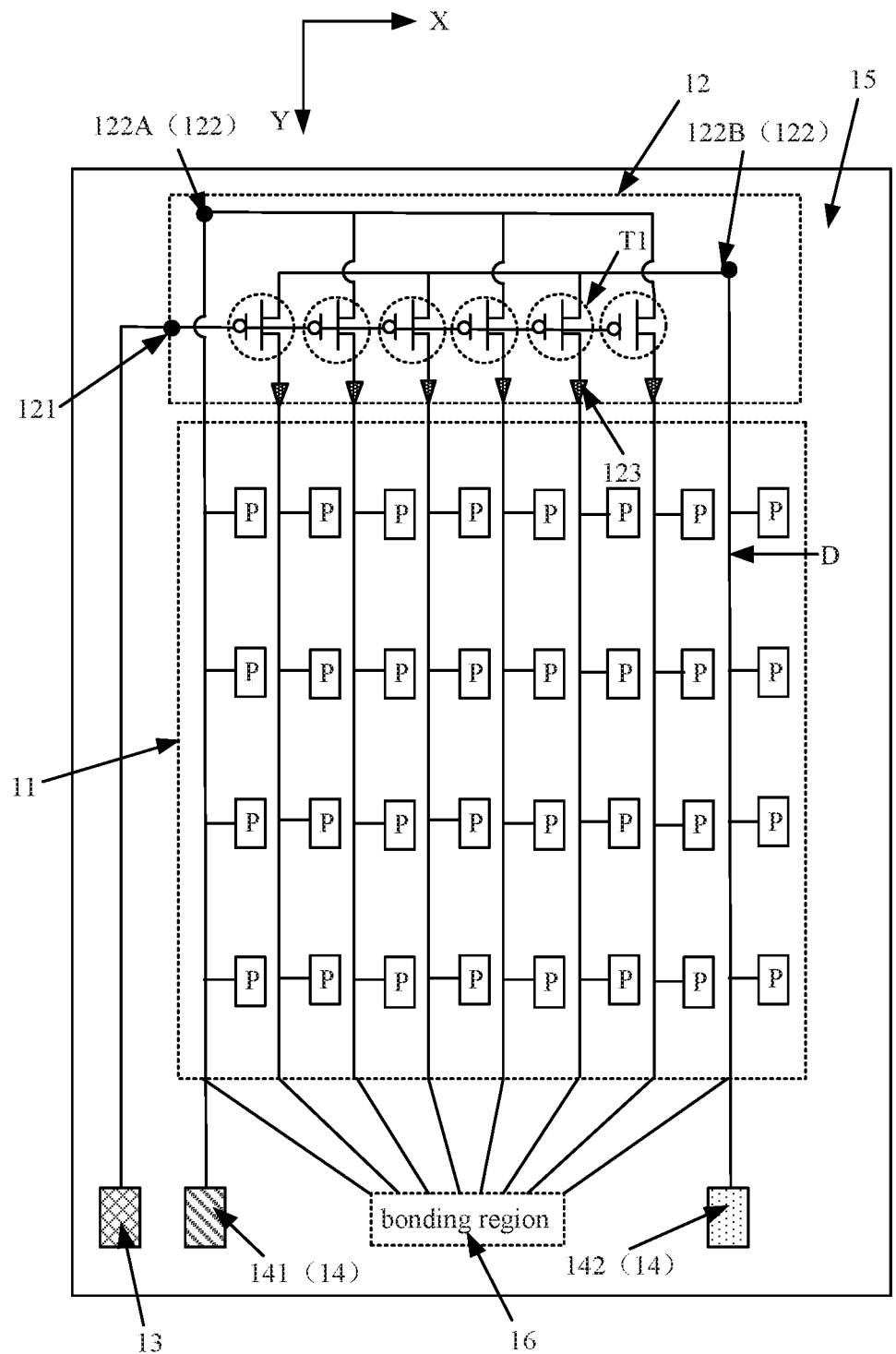
FIG. 3A is a schematic structural diagram of a display panel according to an embodiment of the present disclosure.

Reference is made to FIG. 3A, which is a schematic structural diagram of a display panel according to an embodiment of the present disclosure. The embodiment shown in FIG. 3A differs from the embodiment shown FIG. 1A as follows. All of the pixel units P are arranged in a matrix. The odd pin 141 is electrically connected to the odd input end 122A via the data line D electrically connected to an odd column of the pixel units P and the data lines D electrically connected to the remaining odd columns of the pixel units P are electrically connected to the odd input end 122A via the output ends 123 corresponding to the data lines D electrically connected to the remaining odd columns of the pixel units P respectively. The even pin 142 is electrically connected to the even input end 122B via the data line D electrically connected to an even column of the pixel units P and the data lines D electrically connected to the remaining even columns of the pixel units P are electrically connected to the even input end 122B via the output ends 123 corresponding to the data lines D electrically connected to the remaining even columns of the pixel units P respectively.

Figure 3B:
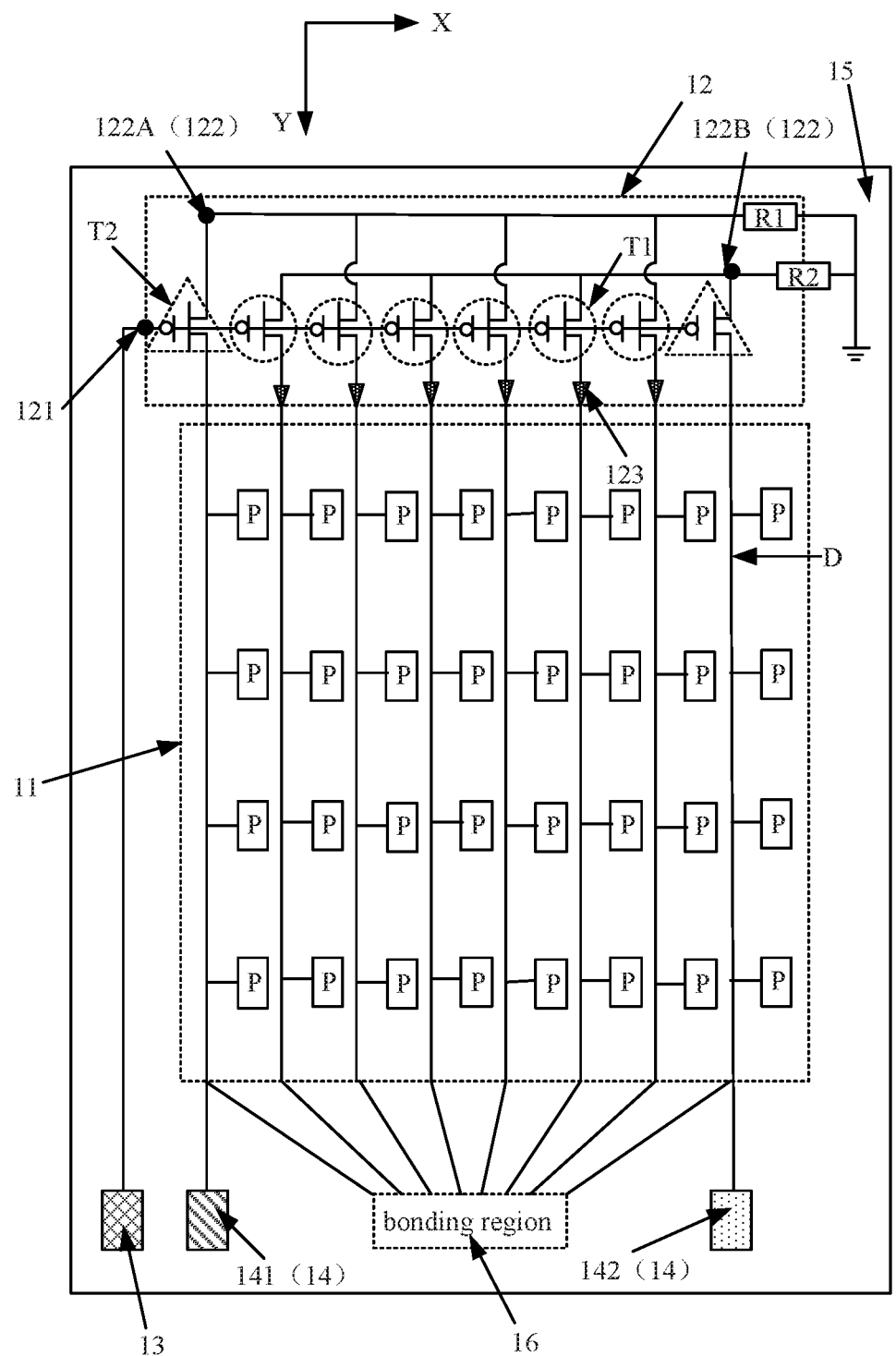
FIG. 3B is a schematic structural diagram of a display panel according to an embodiment of the present disclosure.

Reference is made to FIG. 3B, which is a schematic structural diagram of a display panel according to an embodiment of the present disclosure. In the embodiment shown in FIG. 3B, the data line D connected to the test pin 14 is connected to the input end 122 via one second thin film transistor T2. In this case, all of the data lines are connected to the input end 122 via the thin film transistors respectively, thereby ensuring the reliability and stability of the test switching circuit 12. Likewise, to avoid the leakage current and residual charges on thin film transistors in the test switching circuit 12 from interfering the performance of the display panel, the second electrodes of all of the thin film transistors connected to the odd input end 122A are grounded via a first resistor R1, and the second electrodes of all of the thin film transistors connected to the even input end 122B are grounded via a second resistor R2. In other embodiments, the resistor may be connected to a preset voltage input end.

In a case that the pixel units P are arranged in a matrix, similar to the above embodiments, four test pins 14 may be arranged to improve the drive capability. Two of the test pins 14 are configured to simultaneously provide test signals to the odd input end 122 A, and the other two test pins 14 are configured to simultaneously provide test signals to the even input end 122B. The test signal is provided to the odd input end 122A and the even input end 122B in a time-sharing manner. In this case, on the basis of the above embodiments, the structure of the display panel may be as shown in FIG. 4A.

Figure 4A:
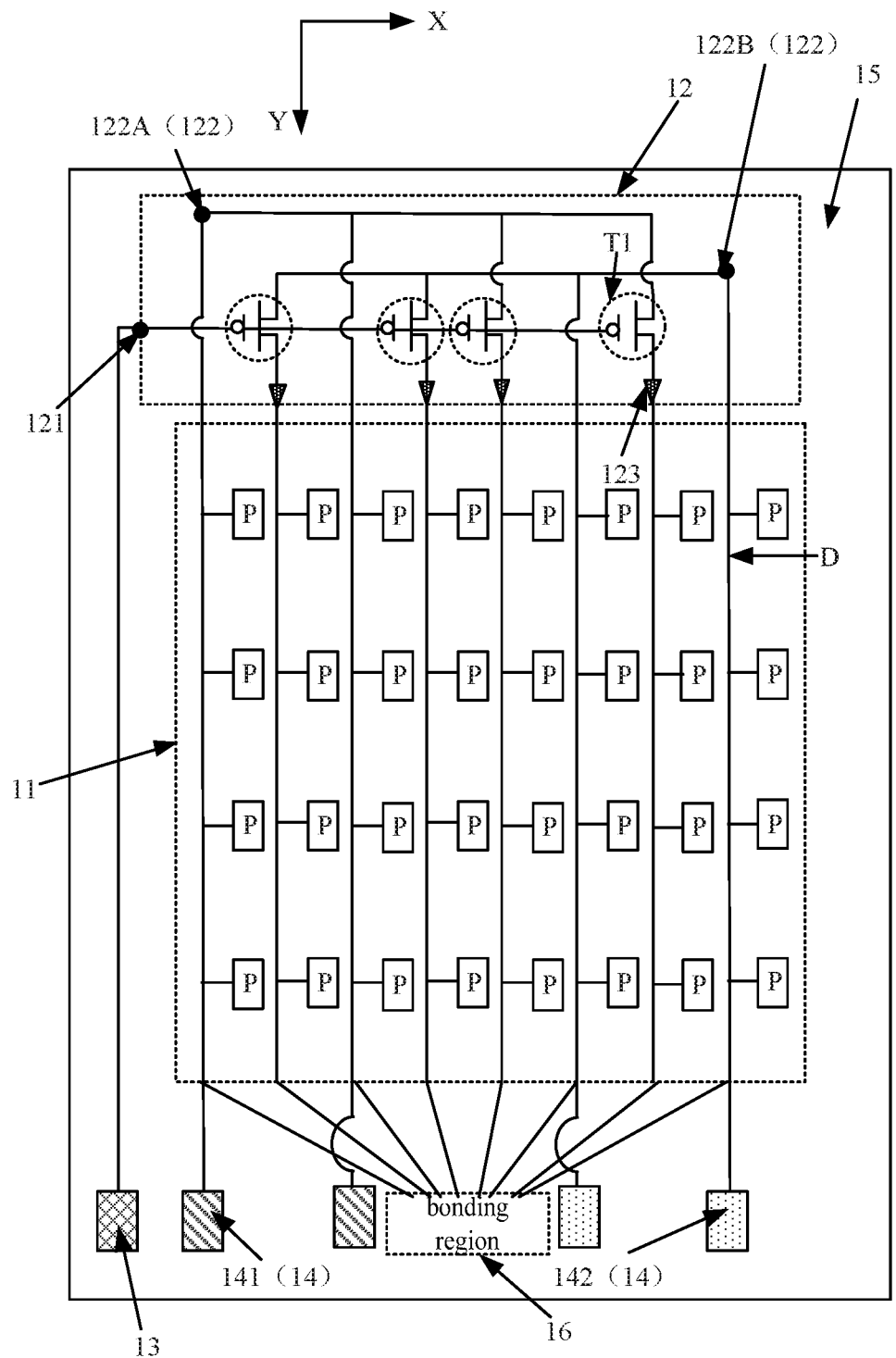
FIG. 4A is a schematic structural diagram of a display panel according to an embodiment of the present disclosure.

Reference is made to FIG. 4A, which is a schematic structural diagram of a display panel according to an embodiment of the present disclosure. The embodiment shown in FIG. 4A differs from the embodiment shown in FIG. 3A in that: m=4, two of the four test pins 14 are odd pins 141, and the other two of the four test pins 14 are even pins 142. In one embodiment, one odd pin 141 is electrically connected to the odd input end 122A via the data line D electrically connected to an odd column of the pixel units P, the other odd pin 141 is electrically connected to the odd input end 122A via the data line D electrically connected to another odd column of the pixel units P, and the data lines D electrically connected to the remaining odd columns of the pixel units P are electrically connected to the odd input end 122A via the output ends 123 corresponding to the data lines D electrically connected to the remaining odd columns of the pixel units P respectively.

One even pin 142 is electrically connected to the even input end 122B via the data line D electrically connected to an even column of the pixel units P, the other even pin 142 is electrically connected to the even input end 122B via the data line D electrically connected to another even column of the pixel units P. and the data lines D electrically connected to the remaining even columns of the pixel units P are electrically connected to the even input end 122B via the output ends 123 corresponding to the data lines D electrically connected to the remaining even columns of the pixel units P respectively.

Figure 4B:
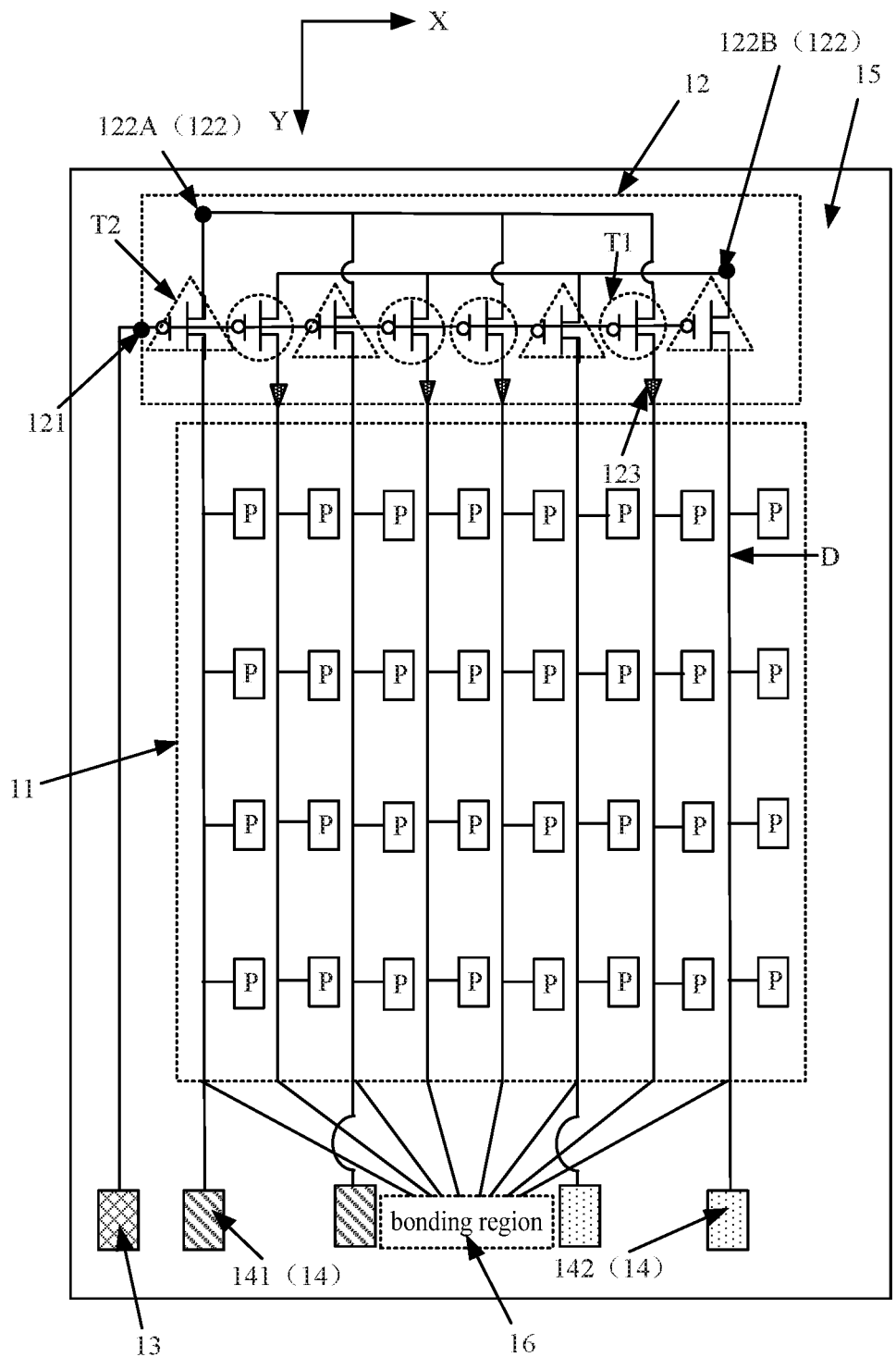
FIG. 4B is a schematic structural diagram of a display panel according to an embodiment of the present disclosure.

Reference is made to FIG. 4B, which is a schematic structural diagram of a display panel according to an embodiment of the present disclosure. In the embodiment shown in FIG. 4B, the data line D connected to the test pin 14 is connected to the input end 122 via one second thin film transistor T2. In this case, all of the data lines are connected to the input end 122 via the thin film transistors respectively, thereby ensuring the reliability and stability of the test switching circuit 12. Likewise, to avoid the leakage current and residual charges on thin film transistors in the test switching circuit 12 from interfering the performance of the display panel, the second electrodes of all of the thin film transistors connected to the odd input end 122A are grounded via a first resistor R1, and the second electrodes of all of the thin film transistors connected to the even input end 122B are grounded via a second resistor R2. In other embodiments, the resistor may be connected to a preset voltage input end.

In a case that the display panel includes the pixel units P with three different colors including a first color, a second color and a third color. The pixel units P in a same column have a same color, and colors of any three sequential pixel units P in a same row are different from each other. In addition, the test switching circuit may include three input ends, i.e., a=3. In this case, on the basis of the above embodiments, the structure of the display panel may be as shown in FIG. 5A.

Figure 5A:
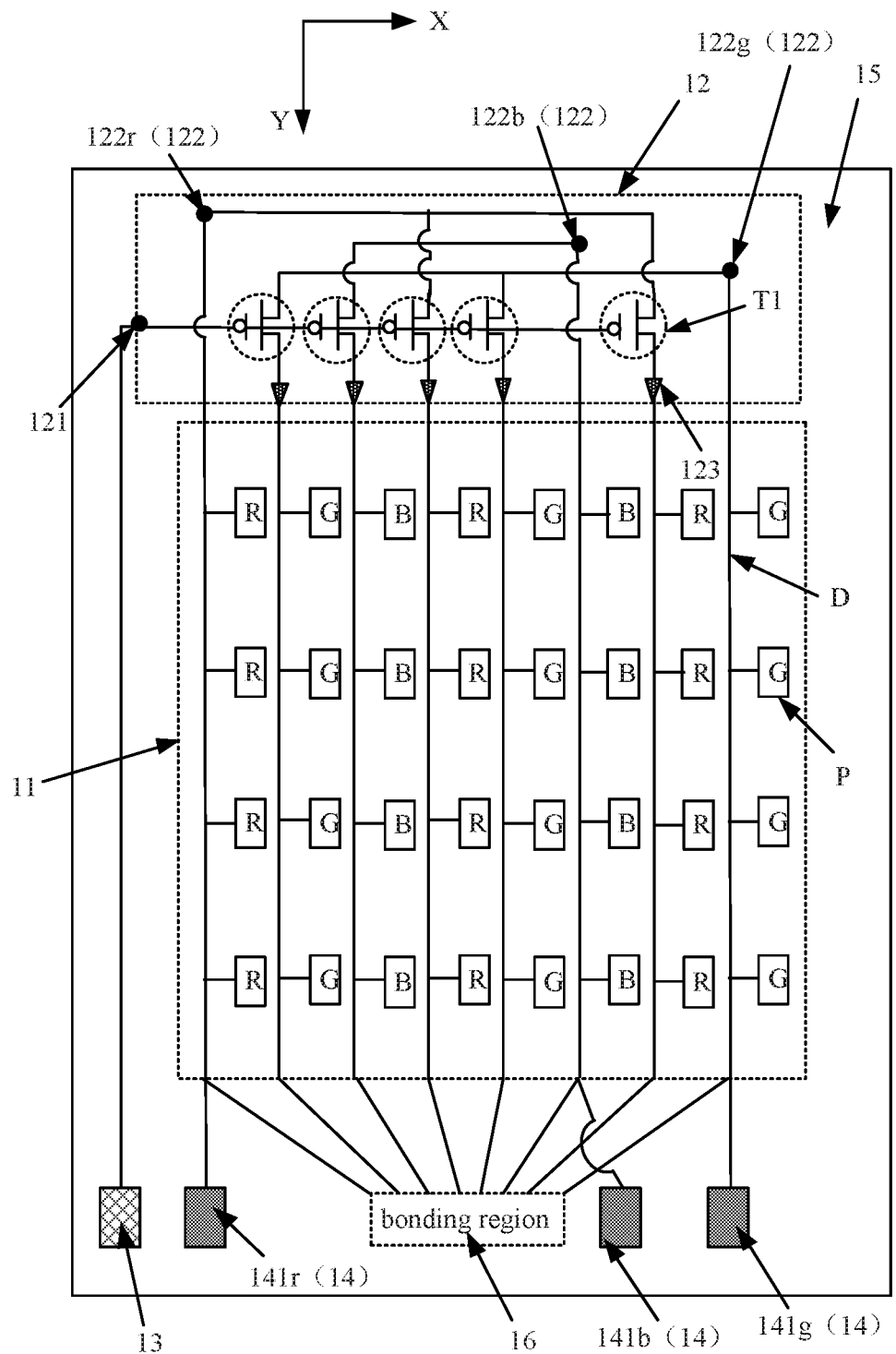
FIG. 5A is a schematic structural diagram of a display panel according to an embodiment of the present disclosure.

Reference is made to FIG. 5A, which is a schematic structural diagram of a display panel according to an embodiment of the present disclosure. The display panel includes three input ends 122 including a first input end 122r, a second input end 122g and a third input end 122b.

In the embodiment shown in FIG. 5A, the first color is red R, the second color is green G and the third color is blue B. The display panel includes three test pins 14, i.e., m=3. The three test pins 14 are a first pin 141r, a second pin 141g, and a third pin 141b respectively.

The first pin 141r is electrically connected to the first input end 122r via the data line D electrically connected to a column of the pixel units P with the first color R, and the data lines D electrically connected to the remaining columns of the pixel units P with the first color R are electrically connected to the first input end 122r via the output ends 123 corresponding to the data lines D electrically connected to the remaining columns of the pixel units P with the first color R respectively. The second pin 141g is electrically connected to the second input end 122g via the data line D electrically connected to a column of the pixel units P with the second color G. and the data lines D electrically connected to the remaining columns of the pixel units P with the second color G are electrically connected to the second input end 122g via the output ends 123 corresponding to the data lines D electrically connected to the remaining columns of the pixel units P with the second color G respectively. The third pin 141b is electrically connected to the third input end 122b via the data line D electrically connected to a column of the pixel units P with the third color B, and the data lines D electrically connected to the remaining columns of the pixel units P with the third color B are electrically connected to the third input end 122b via the output ends 123 corresponding to the data lines D electrically connected to the remaining columns of the pixel units P with the third color B respectively.

Figure 5B:
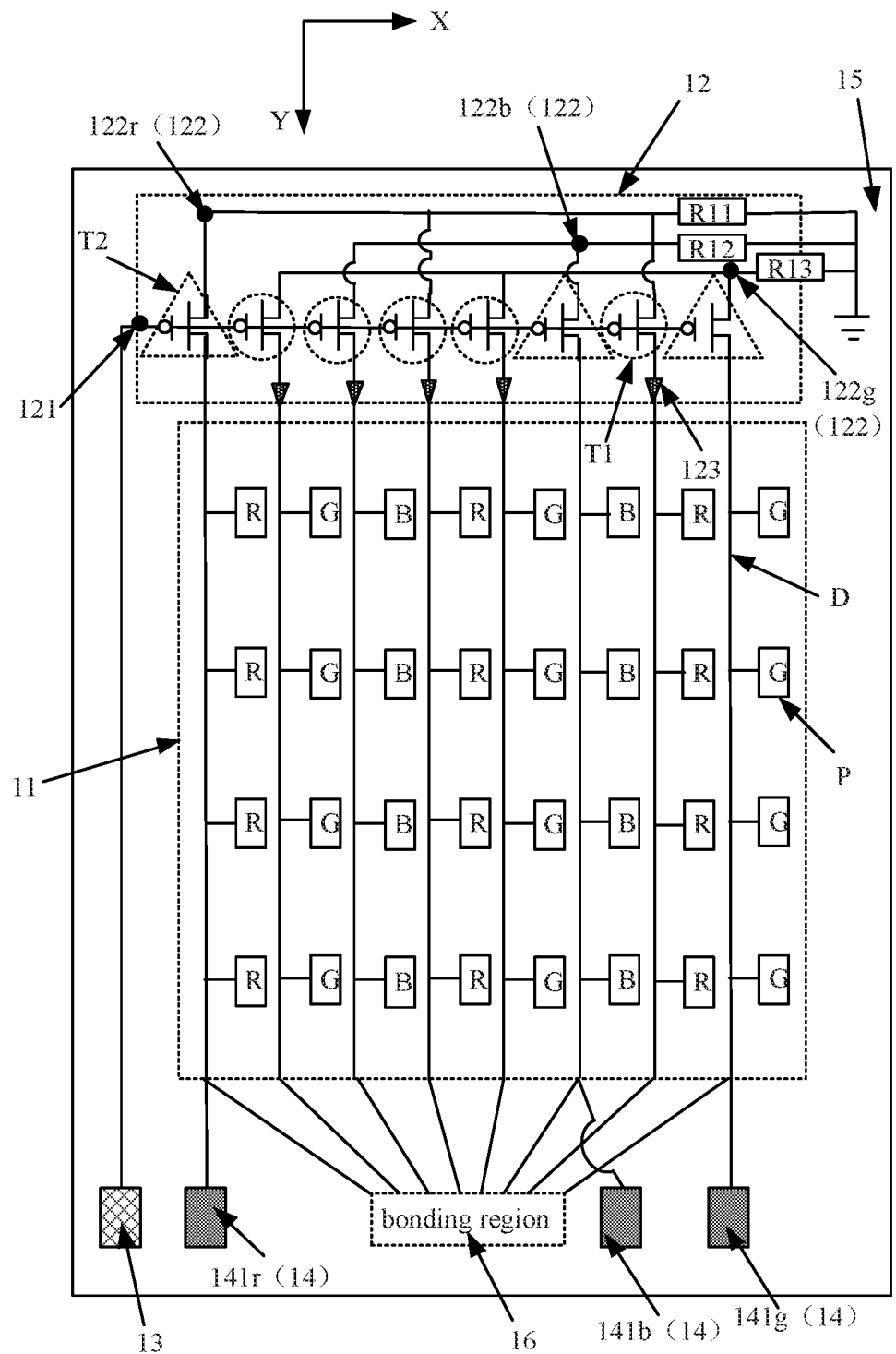
FIG. 5B is a schematic structural diagram of a display panel according to an embodiment of the present disclosure.

Reference is made to FIG. 5B, which is a schematic structural diagram of a display panel according to an embodiment of the present disclosure. In the embodiment shown in FIG. 5B, the data line D connected to the test pin 14 is connected to the input end 122 via one second thin film transistor T2. In this case, all of the data lines are connected to the input end 122 via the thin film transistors respectively, thereby ensuring the reliability and stability of the test switching circuit 12. Likewise, to avoid the leakage current and residual charges on thin film transistors in the test switching circuit 12 from interfering the performance of the display panel, the second electrodes of all of the thin film transistors connected to the first input end 122r are grounded via a resistor R11, the second electrodes of all of the thin film transistors connected to the second input end 122g are grounded via a resistor R13 and the second electrodes of all of the thin film transistors connected to the third input end 122b are grounded via a resistor R12. In other embodiments, the resistor may be connected to a preset voltage input end.

In the display panel according to an embodiment of the present disclosure, the display panel further includes the drive chip arranged in the bonding region. After the test result indicates that no problem occurs in the display panel, the drive chip is bound in the bonding region. The drive chip is arranged at the side of the display array 11 where the test pins 14 are arranged, thereby facilitating the electrical connection between the drive chip and the data lines D with short wires. The drive chip may be connected to the data lines D via a data selection circuit including multiple thin film transistors, so that the drive chip provides display drive signals to all of the data lines D via a few ports.

The drive chip is connected to the drive pin 13. During a display, the drive chip is configured to provide the switch control signal, which controls to switch on or switch off all of the thin film transistors in the test switching circuit 12, to the drive pin, so as to ensure display drive signals for the data lines D are isolated from each other.

As can be seen from the above descriptions, in the display panel according to the embodiments of the present disclosure, the test pins are electrically connected to the input ends via a portion of the data lines and provide the test signals via these data lines, and the remaining data lines are electrically connected to the output ends. No signal line needs to be arranged for the test pins in the border region by reusing the data lines as the signal line for the test pins, thereby reducing the width of the border region and facilitating the narrow border design of the display panel.

Figure 6:
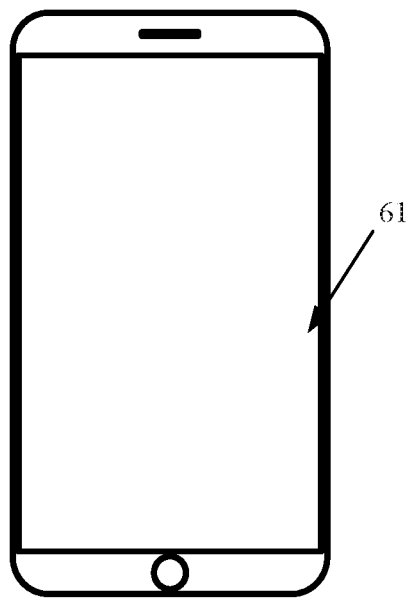
FIG. 6 is a schematic structural diagram of an electronic device according to an embodiment of the present disclosure.

On the basis of the above embodiments of the display panel, an electronic device is provided according to an embodiment of the present disclosure, as shown in FIG. 6. FIG. 6 is a schematic structural diagram of an electronic device according to an embodiment of the disclosure. The electronic device includes a display panel 61, and the display panel 61 is the display panel according to the above embodiments. It should be noted that, the display panel according to the above embodiments may be an LCD display panel or an OLED display panel, also may be a micro LED display panel (micro LED, or μLED), a Quantum Dot Light Emitting Display (QLED) display panel, an electrophoretic display, an electrowetting display panel or the like, which is not limited herein.

The electronic device according to the present disclosure may be an electronic device with a display function, such as a mobile phone, a computer and a television. The electronic device with the display panel according to the above embodiments has a smaller border width, since the data line is reused to perform a display test on the pixel units instead of additionally arranging the signal line for the test pin in the border region.

Figure 7:
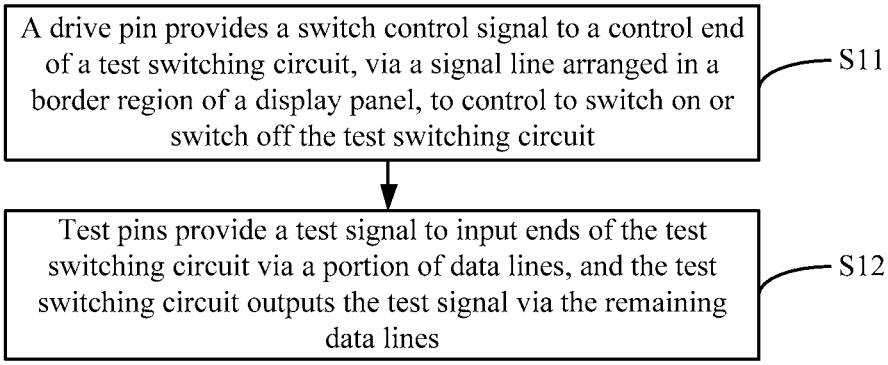
FIG. 7 is a schematic flowchart of a test method according to an embodiment of the present disclosure.

On the basis of the above embodiments of the display panel, a test method is further provided according to an embodiment of the present disclosure. The test method is used for performing a display test on the pixel units of the above display panel. The test method is as shown in FIG. 7, which is a schematic flowchart of a test method according to an embodiment of the disclosure. The test method includes steps S11 and S12.

In step S11, the drive pin provides the switch control signal to the control end of the test switching circuit, via the signal line arranged in the border region of the display panel, to control to switch on or switch off the test switching circuit.

In step S12, the test pins provide the test signal to the input ends of the test switching circuit via a portion of the data lines, and the test switching circuit outputs the test signal via the remaining data lines.

In an embodiment, in the display panel, the test switching circuit includes two input ends which are an odd input end and an even input end respectively, and the display panel includes two test pins which are an odd pin and an even pin respectively.

In this case, the providing, by the test pins, the test signal to the input ends of the test switching circuit via the portion of the data lines, and outputting, by the test switching circuit, the test signal via the remaining data lines includes:

providing a first test signal to the odd input end by electrically connecting the odd pin to the odd input end via the data line electrically connected to an odd column of the pixel units, and acquiring the first test signal outputted via the output ends corresponding to the data lines electrically connected to the remaining odd columns of the pixel units by electrically connecting the data lines electrically connected to the remaining odd columns of the pixel units to the odd input end via the output ends respectively; and providing a second test signal to the even input end by electrically connecting the even pin to the even input end via the data line electrically connected to an even column of the pixel units, and acquiring the second test signal outputted via the output ends corresponding to the data lines electrically connected to the remaining even columns of the pixel units by electrically connecting the data lines electrically connected to the remaining even columns of the pixel units to the even input end via the output ends respectively.

In the test method, the first test signal is provided via one test pin, and the second test signal is provided via the other test pin, and the first test signal and the second test signal are provided in a time-sharing manner to test whether the pixel units display normally. In the method, the first test signal and the second test signal are respectively provided via the data line corresponding to the pixel units in the odd column and the data line corresponding to the pixel unit in the even column in a time-sharing manner.

In another embodiment, the test switching circuit includes two input ends which are an odd input end and an even input end respectively, and the display panel includes four test pins of which two test pins are odd pins and the other two test pins are even pins.

In this case, the providing, by the test pins, the test signal to the input ends of the test switching circuit via the portion of the data lines, and outputting, by the test switching circuit, the test signal via the remaining data lines includes:

providing a first test signal to the odd input end via the two odd pins simultaneously by electrically connecting one of the two odd pins to the odd input end via the data line electrically connected to an odd column of the pixel units and electrically connecting the other one of the two odd pins to the odd input end via the data line electrically connected to another odd column of the pixel units, and acquiring the first test signal outputted via the output ends corresponding to the data lines electrically connected to the remaining odd columns of the pixel units by electrically connecting the data lines electrically connected to the remaining odd columns of the pixel units to the odd input end via the output ends respectively; and providing a second test signal to the even input end via the two even pins simultaneously by electrically connecting one of the two even pins to the even input end via the data line electrically connected to an even column of the pixel units and electrically connecting the other one of the two even pins to the even input end via the data line electrically connected to another even column of the pixel units, and acquiring the second test signal outputted via the output ends corresponding to the data lines electrically connected to the remaining even columns of the pixel units by electrically connecting the data lines electrically connected to the remaining even columns of the pixel units to the even input end via the output ends respectively.

In the test method, in the case that the first test signal and the second test signal are respectively inputted via the data line corresponding to the pixel units in the odd column and the data line corresponding to the pixel units in the even column in a time-sharing manner, the first test signal is simultaneously provided by two test pins, and the second test signal is simultaneously provided by the other two test pins, thereby improving the drive capability.

In an embodiment, the test switching circuit includes two input ends which are an odd input end and an even input end respectively, the display panel includes two test pins which are an odd pin and an even pin respectively, and the display panel includes 2N data lines divided equally into N groups in a second direction, with each of the N groups including two adjacent data lines, where the i-th group includes the (2i−1)-th data line and the 2i-th data line, with i being a positive integer not greater than N.

In this case, the providing, by the test pins, the test signal to the input ends of the test switching circuit via the portion of the data lines, and outputting, by the test switching circuit, the test signal via the remaining data lines includes:

providing a first test signal to the odd input end by electrically connecting the odd pin to the odd input end via one of the data lines in an odd group of the N groups, and acquiring the first test signal outputted via the output ends corresponding to the remaining N−1 data lines in all of odd groups of the N groups by electrically connecting the remaining N−1 data lines in all of the odd groups to the odd input end via the output ends respectively; and providing a second test signal to the even input end by electrically connecting the even pin to the even input end via one of the data lines in an even group of the N groups, and acquiring the second test signal outputted via the output ends corresponding to the remaining N−1 data lines in all of even groups of the N groups by electrically connecting the remaining N−1 data lines in all of the even groups to the even input end via the output ends respectively.

In the test method, the first test signal is provided via one test pin, and the second test signal is provided via the other test pin, and the first test signal and the second test signal are provided in a time-sharing manner to test whether the pixel units display normally. In the method, the data lines are grouped in pairs, and the first test signal and the second test signal are respectively inputted via the odd group and the even group in a time-sharing manner.

In an embodiment, the test switching circuit includes two input ends which are an odd input end and an even input end respectively, the display panel includes four test pins of which two test pins are odd pins and the other two test pins are even pins, and the display panel includes 2N data lines divided equally into N groups in a second direction, with each of the N groups including two adjacent data lines, where the i-th group includes the (2i−1)-th data line and the 2i-th data line, with i being a positive integer not greater than N.

In this case, the providing, by the test pins, the test signal to the input ends of the test switching circuit via the portion of the data lines, and outputting, by the test switching circuit, the test signal via the remaining data lines includes:

providing a first test signal to the odd input end by electrically connecting the two odd pins to the odd input end via two data lines in a same odd group of the N groups respectively, and acquiring the first test signal outputted via the output ends corresponding to the remaining N−2 data lines in all of odd groups of the N groups by electrically connecting the remaining N−2 data lines in all of the odd groups to the odd input end via the output ends respectively; and providing a second test signal to the even input end by electrically connecting the two even pins to the even input end via two data lines in a same even group of the N groups respectively, and acquiring the second test signal outputted via the output ends corresponding to the remaining N−2 data lines in all of even groups of the N groups by electrically connecting the remaining N−2 data lines in all of the even groups to the even input end via the output ends respectively.

In the test method, the data lines are grouped in pairs. In the case that the first test signal and the second test signal are respectively inputted via the odd group and the even group in a time-sharing manner, the first test signal is simultaneously provided via two test pins, and the second test signal is simultaneously provided via the other two test pins, thereby improving the drive capability.

In an embodiment, the pixel units of the display panel have three different colors including a first color, a second color and a third color, the pixel units in a same column of the display array have a same color and colors of any three sequential pixel units in a same row of the display array are different from each other, the test switching circuit includes three input ends which are a first input end, a second input end and a third input end respectively, and the display panel includes three test pins which are a first pin, a second pin and a third pin respectively.

In this case, the providing, by the test pins, the test signal to the input ends of the test switching circuit via the portion of the data lines, and outputting, by the test switching circuit, the test signal via the remaining data lines includes:

providing a test signal for the pixel units with the first color to the first input end by electrically connecting the first pin to the first input end via the data line electrically connected to a column of the pixel units with the first color, and acquiring the test signal for the pixel units with the first color by electrically connecting the data lines electrically connected to the remaining columns of the pixel units with the first color to the first input end via the output ends corresponding to the data lines electrically connected to the remaining columns of the pixel units with the first color respectively:

providing a test signal for the pixel units with the second color to the second input end by electrically connecting the second pin to the second input end via the data line electrically connected to a column of the pixel units with the second color, and acquiring the test signal for the pixel units with the second color by electrically connecting the data lines electrically connected to the remaining columns of the pixel units with the second color to the second input end via the output ends corresponding to the data lines electrically connected to the remaining columns of the pixel units with the second color respectively, and providing a test signal for the pixel units with the third color to the third input end by electrically connecting the third pin to the third input end via the data line electrically connected to a column of the pixel units with the third color, and acquiring the test signal for the pixel units with the third color by electrically connecting the data lines electrically connected to the remaining columns of the pixel units with the third color to the third input end via the output ends corresponding to the data lines electrically connected to the remaining columns of the pixel units with the third color respectively.

In the test method, the test signal for the pixel units with the first color is provided via the first pin, the test signal for the pixel units with the second color is provided via the second pin and the test signal for the pixel units with the third color is provided via the third pin. In other words, the test signal for the pixel units with the first color, the test signal for the pixels units with the second color and the test signal for the pixel units with the third color are respectively provided via three different test pins in a time-sharing manner, to test whether the pixel units display normally.

In the test method according to the embodiment of the present disclosure, the test pin provides the test signal via a portion of the data lines, and the test signal is inputted to the remaining data lines via the test switching circuit, without additionally arranging the signal line for the test pin, therefore the test method is simple and has a low cost, thereby facilitating a narrow border design of the display panel.

The embodiments in the specification are described in a progressive manner, and each embodiment lays emphasis on differences from other embodiments. Therefore, one embodiment can refer to other embodiments for the same or similar parts. Since each of the test method and the electronic device disclosed in the embodiments corresponds to the display panel disclosed in the embodiments, the test method and the electronic device are described simply, and relevant parts may refer to the corresponding descriptions of the display panel.

According to the description of the disclosed embodiments, those skilled in the art can implement or practice the present disclosure. Various modifications made to these embodiments may be apparent to those skilled in the art, and the general principle defined herein may be implemented in other embodiments without departing from the spirit or scope of the present disclosure. Therefore, the present disclosure is not limited to the embodiments described herein but confirms to the widest scope in accordance with principles and novel features disclosed herein.

The invention claimed is:

1. A display panel, comprising:
   a plurality of data lines arranged in parallel and extending in a first direction;
   a display array comprising a plurality of pixel units arranged in an array, wherein the number of columns of the pixel units is equal to the number of the data lines, and the columns of the pixel units are electrically connected to the data lines respectively;
   a test switching circuit arranged at one side of the display array in the first direction; and
   test pins and a drive pin arranged at the other side of the display array in the first direction,
   wherein, the test switching circuit comprises a control end, input ends and output ends, the drive pin is electrically connected to the control end and is configured to input a switch control signal, the test pins are configured to input a test signal and are electrically connected to the input ends via a portion of the data lines, and the remaining data lines are electrically connected to the output ends.

2. The display panel according to claim 1, wherein,
the number of the test pins is represented as m, with m being a positive integer;
the number of the data lines is represented as n, with n being a positive integer;
the test switching circuit comprises one control end, a input ends, and b output ends, with both a and b being positive integers; and
wherein, m, n, a and b meet following relational expressions: a+b≤n, a≤m and m+b=n, the test pins are electrically connected to the input ends via the portion of the data lines respectively, and the output ends are electrically connected to the remaining data lines respectively.

3. The display panel according to claim 2, wherein, the test switching circuit comprises b first thin film transistors arranged in sequence in a second direction, the second direction is perpendicular to the first direction and is parallel to a row direction of the pixel units, and the first thin film transistors correspond to the output ends respectively; and
each of the first thin film transistors comprises a control electrode, a first electrode and a second electrode, the first electrodes of the first thin film transistors are electrically connected to the output ends corresponding to the first thin film transistors respectively, the control electrodes of all of the first thin film transistors are electrically connected to the control end, and the second electrode of each of the first thin film transistors is electrically connected to one of the input ends.

4. The display panel according to claim 3, wherein, a=2, and two input ends are an odd input end and an even input end respectively.

5. The display panel according to claim 4, wherein, n is an even number and n=2N, with N being a positive integer;
in the second direction, 2N data lines are divided equally into N groups, with each of the groups comprising two adjacent data lines, wherein the i-th group comprises the (2i−1)-th data line and the 2i-th data line, with i being a positive integer not greater than N;
m=2, and two test pins are an odd pin and an even pin respectively;
the odd pin is electrically connected to the odd input end via one of the data lines in an odd group of the N groups, and the remaining N−1 data lines in all of odd groups of the N groups are electrically connected to the odd input end via the output ends corresponding to the remaining N−1 data lines in all of the odd groups respectively; and
the even pin is electrically connected to the even input end via one of the data lines in an even group of the N groups, and the remaining N−1 data lines in all of even groups of the N groups are electrically connected to the even input end via the output ends corresponding to the remaining N−1 data lines in all of the even groups respectively.

6. The display panel according to claim 4, wherein, n is an even number and n=2N, with N being a positive integer;
in the second direction, 2N data lines are divided equally into N groups, with each of the groups comprising two adjacent data lines, wherein the i-th group comprises the (2i−1)-th data line and the 2i-th data line, with i being a positive integer not greater than N;
m=4, and four test pins comprises two odd pins and two even pins;
the two odd pins are electrically connected to the odd input end via two data lines in a same odd group of the N groups respectively, and the remaining N−2 data lines in all of odd groups of the N groups are electrically connected to the odd input end via the output ends corresponding to the remaining N−2 data lines in all of the odd groups respectively; and
the two even pins are electrically connected to the even input end via two data lines in a same even group of the N groups respectively, and the remaining N−2 data lines in all of even groups of the N groups are electrically connected to the even input end via the output ends corresponding to the remaining N−2 data lines in all of the even groups respectively.

7. The display panel according to claim 4, wherein, m=2, two test pins are an odd pin and an even pin respectively;
the odd pin is electrically connected to the odd input end via the data line electrically connected to an odd column of the pixel units, and the data lines electrically connected to the remaining odd columns of the pixel units are electrically connected to the odd input end via the output ends corresponding to the data lines electrically connected to the remaining odd columns of the pixel units respectively; and
the even pin is electrically connected to the even input end via the data line electrically connected to an even column of the pixel units, and the data lines electrically connected to the remaining even columns of the pixel units are electrically connected to the even input end via the output ends corresponding to the data lines electrically connected to the remaining even columns of the pixel units respectively.

8. The display panel according to claim 4, wherein, m=4, and four test pins comprises two odd pins and two even pins;
one of the two odd pins is electrically connected to the odd input end via the data line electrically connected to an odd column of the pixel units, the other one of the two odd pins is electrically connected to the odd input end via the data line electrically connected to another odd column of the pixel units, and the data lines electrically connected to the remaining odd columns of the pixel units are electrically connected to the odd input end via the output ends corresponding to the data lines electrically connected to the remaining odd columns of the pixel units respectively; and
one of the two even pins is electrically connected to the even input end via the data line electrically connected to an even column of the pixel units, the other one of the two even pins is electrically connected to the even input end via the data line electrically connected to another even column of the pixel units, and the data lines electrically connected to the remaining even columns of the pixel units are electrically connected to the even input end via the output ends corresponding to the data lines electrically connected to the remaining even columns of the pixel units respectively.

9. The display panel according to claim 3, wherein, the pixel units of the display panel have three different colors comprising a first color, a second color and a third color, the pixel units in a same column of the display array have a same color, and colors of any three sequential pixel units in a same row of the display array are different from each other; and a=3, and three input ends comprises a first input end, a second input end and a third input end.

10. The display panel according to claim 9, wherein, m=3, and three test pins are a first pin, a second pin and a third pin respectively;
the first pin is electrically connected to the first input end via the data line electrically connected to a column of the pixel units with the first color, and the data lines electrically connected to the remaining columns of the pixel units with the first color are electrically connected to the first input end via the output ends corresponding to the data lines electrically connected to the remaining columns of the pixel units with the first color respectively;
the second pin is electrically connected to the second input end via the data line electrically connected to a column of the pixel units with the second color, and the data lines electrically connected to the remaining columns of the pixel units with the second color are electrically connected to the second input end via the output ends corresponding to the data lines electrically connected to the remaining columns of the pixel units with the second color respectively; and
the third pin is electrically connected to the third input end via the data line electrically connected to a column of the pixel units with the third color, and the data lines electrically connected to the remaining columns of the pixel units with the third color are electrically connected to the third input end via the output ends corresponding to the data lines electrically connected to the remaining columns of the pixel units with the third color respectively.

11. The display panel according to claim 3, wherein the test switching circuit further comprises m second thin film transistors, and each of the second thin film transistors comprises a control electrode, a first electrode and a second electrode; and
the control electrodes of all of the second thin film transistors are electrically connected to the control end, the first electrodes of the second thin film transistors are electrically connected to the test pins corresponding to the second thin film transistors via the data lines corresponding to the second thin film transistors respectively, and the second electrodes of the second thin film transistors are electrically connected to the input ends.

12. The display panel according to claim 11, wherein the second thin film transistor has a greater channel width to length ratio than the first thin film transistor.

13. The display panel according to claim 3, wherein, a bonding region is arranged at the side of the display array where the test pins are arranged, and the bonding region is configured to bond a drive chip; and
in a case that the number of the test pins is more than one, the test pins are arranged in sequence in the second direction, and the bonding region is arranged between two of the test pins.

14. The display panel according to claim 3, wherein, the second electrodes of all of the first thin film transistors electrically connected to a same input end are grounded or electrically connected to a voltage input end via a same resistor; and
the second electrodes of the first thin film transistors electrically connected to different input ends are grounded or electrically connected to the voltage input end via different resistors respectively.

15. The display panel according to claim 14, wherein the resistor is prepared from a semiconductor layer or a metal layer in the display panel.

16. The display panel according to claim 14, wherein, in a case that the test switching circuit comprises second thin film transistors, the first thin film transistors and the second thin film transistors electrically connected to a same input end are grounded or electrically connected to the voltage input end via a same resistor.

17. The display panel according to claim 14, wherein the display panel is a liquid crystal display (LCD) display panel; and
the voltage input end is configured to input one of a common voltage signal, a direct-current voltage signal of a scanning circuit and a data signal of the scanning circuit.

18. The display panel according to claim 14, wherein the display panel is an organic light emitting diode (OLED) display panel; and
the voltage input end is configured to input one of a cathode voltage signal, a direct-current voltage signal of a scanning circuit and a data signal of the scanning circuit.

19. An electronic device, comprising a display panel, wherein the display panel comprises:
a plurality of data lines arranged in parallel and extending in a first direction;
a display array comprising a plurality of pixel units arranged in an array, wherein the number of columns of the pixel units is equal to the number of the data lines, and the columns of the pixel units are electrically connected to the data lines respectively;
a test switching circuit arranged at one side of the display array in the first direction; and
test pins and a drive pin arranged at the other side of the display array in the first direction,
wherein, the test switching circuit comprises a control end, input ends and output ends, the drive pin is electrically connected to the control end and is configured to input a switch control signal, the test pins are configured to input a test signal and are electrically connected to the input ends via a portion of the data lines, and the remaining data lines are electrically connected to the output ends.

20. A test method, applied in a display panel, wherein the display panel comprises:
a plurality of data lines arranged in parallel and extending in a first direction;
a display array comprising a plurality of pixel units arranged in an array, wherein the number of columns of the pixel units is equal to the number of the data lines, and the columns of the pixel units are electrically connected to the data lines respectively;
a test switching circuit arranged at one side of the display array in the first direction; and
test pins and a drive pin arranged at the other side of the display array in the first direction,
wherein, the test switching circuit comprises a control end, input ends and output ends, the drive pin is electrically connected to the control end and is configured to input a switch control signal, the test pins are configured to input a test signal and are electrically connected to the input ends via a portion of the data lines, and the remaining data lines are electrically connected to the output ends; and the test method comprises:
providing, by the drive pin, the switch control signal to the control end of the test switching circuit, via a signal line arranged in a border region of the display panel, to control to switch on or switch off the test switching circuit; and
providing, by the test pins, the test signal to the input ends of the test switching circuit via a portion of the data lines, and outputting, by the test switching circuit, the test signal via the remaining data lines.

* * * * *

UNITED STATES PATENT AND TRADEMARK OFFICE
CERTIFICATE OF CORRECTION

PATENT NO. : 10,529,271 B2
APPLICATION NO. : 15/795210
DATED : January 7, 2020
INVENTOR(S) : Jingxiong Zhou and Ruiyuan Zhou It is certified that error appears in the above-identified patent and that said Letters Patent is hereby corrected as shown below:

On the Title Page

Item [30], delete "Apr. 24, 2017 (CN) 201710240512.3" and insert -- Apr. 24, 2017 (CN) 201710270512.3 --.

Signed and Sealed this
Sixteenth Day of June, 2020

Andrei Iancu
*Director of the United States Patent and Trademark Office*